United States Patent
Kawai et al.

(10) Patent No.: US 8,717,121 B2
(45) Date of Patent: May 6, 2014

(54) BULK ACOUSTIC WAVE RESONATOR

(71) Applicant: Murata Manufacturing Co., Ltd., Nagaokakyo (JP)

(72) Inventors: Hiroshi Kawai, Nagaokakyo (JP); Koichi Yoshida, Nagaokakyo (JP); Naoto Yatani, Nagaokakyo (JP); Makoto Inai, Nagaokakyo (JP)

(73) Assignee: Murata Manufacturing Co., Ltd., Kyota (JP)

( * ) Notice: Subject to any disclaimer, the term of this patent is extended or adjusted under 35 U.S.C. 154(b) by 0 days.

(21) Appl. No.: 13/900,705

(22) Filed: May 23, 2013

(65) Prior Publication Data

US 2013/0249649 A1    Sep. 26, 2013

Related U.S. Application Data

(63) Continuation of application No. PCT/JP2011/077206, filed on Nov. 25, 2011.

(30) Foreign Application Priority Data

Nov. 30, 2010    (JP) ................................ 2010-266105

(51) Int. Cl.
*H03H 9/00* (2006.01)
*H03H 9/15* (2006.01)

(52) U.S. Cl.
USPC .......................................... 333/187; 333/188

(58) Field of Classification Search
USPC ................. 333/186, 187, 188, 189, 190, 191
See application file for complete search history.

(56) References Cited

U.S. PATENT DOCUMENTS

| | | | |
|---|---|---|---|
| 6,204,737 | B1 | 3/2001 | Ella |
| 2005/0162040 | A1 | 7/2005 | Robert |
| 2010/0060386 | A1 | 3/2010 | Belot et al. |

FOREIGN PATENT DOCUMENTS

| | | | |
|---|---|---|---|
| JP | 08-186467 | A | 7/1996 |
| JP | 2000-030595 | A | 1/2000 |
| JP | 2005-528010 | A | 9/2005 |
| JP | 2008-005443 | A | 1/2008 |
| JP | 2010-516213 | A | 5/2010 |

OTHER PUBLICATIONS

Official Communication issued in International Patent Application No. PCT/JP2011/077206, mailed on Jan. 17, 2012.

*Primary Examiner* — Dean O Takaoka
(74) *Attorney, Agent, or Firm* — Keating & Bennett, LLP

(57) ABSTRACT

A bulk acoustic wave resonator includes a substrate, a resonator section in which a piezoelectric film is sandwiched between a pair of electrodes, and a vibration region where the electrodes overlap when viewed in a film thickness direction is defined, an elastically deformable support section that connects the substrate and the resonator section, a membrane arranged between the resonator section and the substrate to face the vibration region of the resonator section and be fixed on the substrate with a space in between, and driver sections that are defined in the resonator section and the substrate adjacent to the vibration region and the membrane, and that move the resonator section toward and away from the substrate. The vibration region of the resonator section contacts the membrane when the driver sections move the resonator section close to the substrate.

20 Claims, 11 Drawing Sheets

BULK ACOUSTIC WAVE RESONATOR

BACKGROUND OF THE INVENTION

1. Field of the Invention

The present invention relates to bulk acoustic wave resonators, and more particularly, to bulk acoustic wave resonators that use bulk acoustic waves (BAW).

2. Description of the Related Art

In conventional art, it is proposed that a bulk acoustic wave resonator (which may also be referred to as "BAW resonator") is provided with a movable section for frequency modulation.

Figure 11:
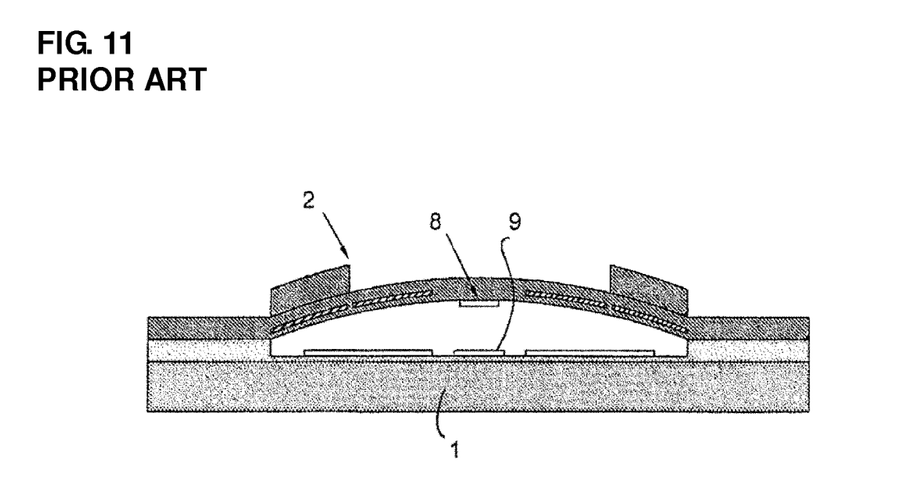
FIG. 11 is a cross sectional view of an exemplary BAW resonator in conventional art.

For example, Japanese Unexamined Patent Application Publication No. 2010-516213 discloses, as illustrated in the cross sectional view of FIG. 11, a structure in which a switching element 2 is fabricated by MEMS technology to push and pull a contact pad 8 to and from an upper surface electrode 9 of a BAW resonator formed on a substrate 1. When the contact pad 8 is away from the upper surface electrode 9, an electrode thickness is relatively thin. Thus, a resonance frequency and an antiresonance frequency of the resonator are relatively high. When the contact pad 8 is in contact with the upper surface electrode 9, the electrode thickness is relatively thick. Thus, the resonance frequency and the antiresonance frequency of the resonator are relatively low.

Japanese Unexamined Patent Application Publication No. 2008-005443 discloses a structure in which a resonator body is provided with a tuning layer thereon, and the thickness of the tuning layer is varied by applying a voltage across electrodes that sandwich the tuning layer to shift a resonant frequency of a resonator.

Japanese Unexamined Patent Application Publication No. 2005-528010 discloses a structure in which electrodes are provided below a resonator with an air gap in between, and a beam portion of the resonator is bended by applying a voltage across those electrodes to shift a resonant frequency of the resonator.

In the case of Japanese Unexamined Patent Application Publication No. 2010-516213, the movable section is formed above the BAW resonator that has a certain thickness. Thus, the structure is complex, and the level of difficulty required for fabrication process is high. In particular, the level of difficulty required for the fabrication process increases when the movable section is driven with an electrostatic force.

In the case of Japanese Unexamined Patent Application Publication No. 2008-005443, the thickness of the tuning layer that is an insulating elastic body is only partially varied. Thus, even if the frequency is shifted at all, the amount of such a shift would be considerably small.

In the case of Japanese Unexamined Patent Application Publication No. 2005-528010, there is no change in the thickness of a piezoelectric film or the thickness of an electrode in a vibration region through which the vibration propagates, and only stress of the vibration region changes. Thus, even if the frequency is shifted at all, the amount of such a shift would be considerably small.

SUMMARY OF THE INVENTION

Preferred embodiments of the present invention provide a bulk acoustic wave resonator that is easily fabricated and is capable of switching its frequency.

The bulk acoustic wave resonator according to a preferred embodiment of the present invention includes: (a) a substrate; (b) a resonator section in which a piezoelectric film is sandwiched between a pair of electrodes and a vibration region is provided, the vibration region being an area where the electrodes overlap with the piezoelectric film disposed therebetween when viewed from a film thickness direction; (c) a support section that is elastically deformable, connects the substrate and the resonator section in a state where one of the electrodes of the resonator section faces a principle surface of the substrate, and allows the one of the electrodes of the resonator section to move toward and away from the principle surface of the substrate; (d) a membrane arranged between the one of the electrodes of the resonator section and the principle surface of the substrate, the membrane facing the vibration region of the resonator section and being fixed on the substrate so as to include a space from the principle surface of the substrate; and (e) driver sections arranged on the resonator section and the substrate adjacent to the vibration region and the membrane, respectively, the driver sections allowing the resonator section to move relative to the substrate such that the one of the electrodes of the resonator section moves toward and away from the principle surface of the substrate. The vibration region of the resonator section contacts the membrane when the driver sections move the one of the electrodes of the resonator section close to the principle surface of the substrate. The vibration region of the resonator section separates from the membrane when the driver sections move the one of the electrodes of the resonator section away from the principle surface of the substrate.

In the above configuration, the resonant frequency and the antiresonant frequency change from when the vibration region of the resonator section is in contact with the membrane to when the vibration region of the resonator section is separated from the membrane.

According to the above configuration, the membrane is arranged between the substrate and the resonator section. Thus, it is easy to fabricate.

It is preferable that the driver sections are: respectively arranged on the resonator section and the substrate; include driver electrodes that face each other; and allow the resonator section to move relative to the substrate with an electrostatic force generated when a voltage is applied across the driver electrodes.

In this case, by using an electrostatic drive mechanism, the driver section may be made simpler in structure and lower in profile.

It is preferable that the membrane is made of a material of which primary component is a metal having an acoustic impedance of about $30 \times 10^5$ g/(cm$^2$·s) or higher, for example.

In this case, the membrane may be made of a hard material, a primary component of which has an acoustic impedance of about $30 \times 10^5$ g/(cm$^2$·s) or higher. The primary component may be, but not limited to, Mo (molybdenum), Ru (ruthenium), Rh (rhodium), Ta (tantalum), W (tungsten), Re (rhenium), Ir (iridium), or Pt (platinum). Accordingly, the resonator's elastic loss may be reduced, and better resonant characteristics may be obtained at the time of frequency modulation.

It is preferable that the membrane is a metal film. Furthermore, it is preferable that a direct current voltage is applied to the metal film of the membrane when the driver sections move the one of the electrodes of the resonator section close to the principle surface of the substrate, and the direct current voltage has a potential difference from that of the one of the electrodes of the resonator section.

In this case, the tightness of contact between the membrane and the electrode of the resonator section may be improved. For example, the state of close contact may be securely maintained even when vibration or impact is applied. Thus, values of the resonant frequency and the antiresonant frequency at the time of frequency modulation become more stable.

Furthermore, preferred embodiments of the present invention provide a filter including a bulk acoustic wave resonator having one of the foregoing configurations.

A bulk acoustic wave resonator according to various preferred embodiments of the present invention may be easily fabricated and capable of switching its frequency.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to FIG. 1 to FIG. 10.

A BAW resonator (bulk acoustic wave resonator) 10 of a first preferred embodiment of the present invention is described with reference to FIG. 1 to FIG. 7.

Figure 1:
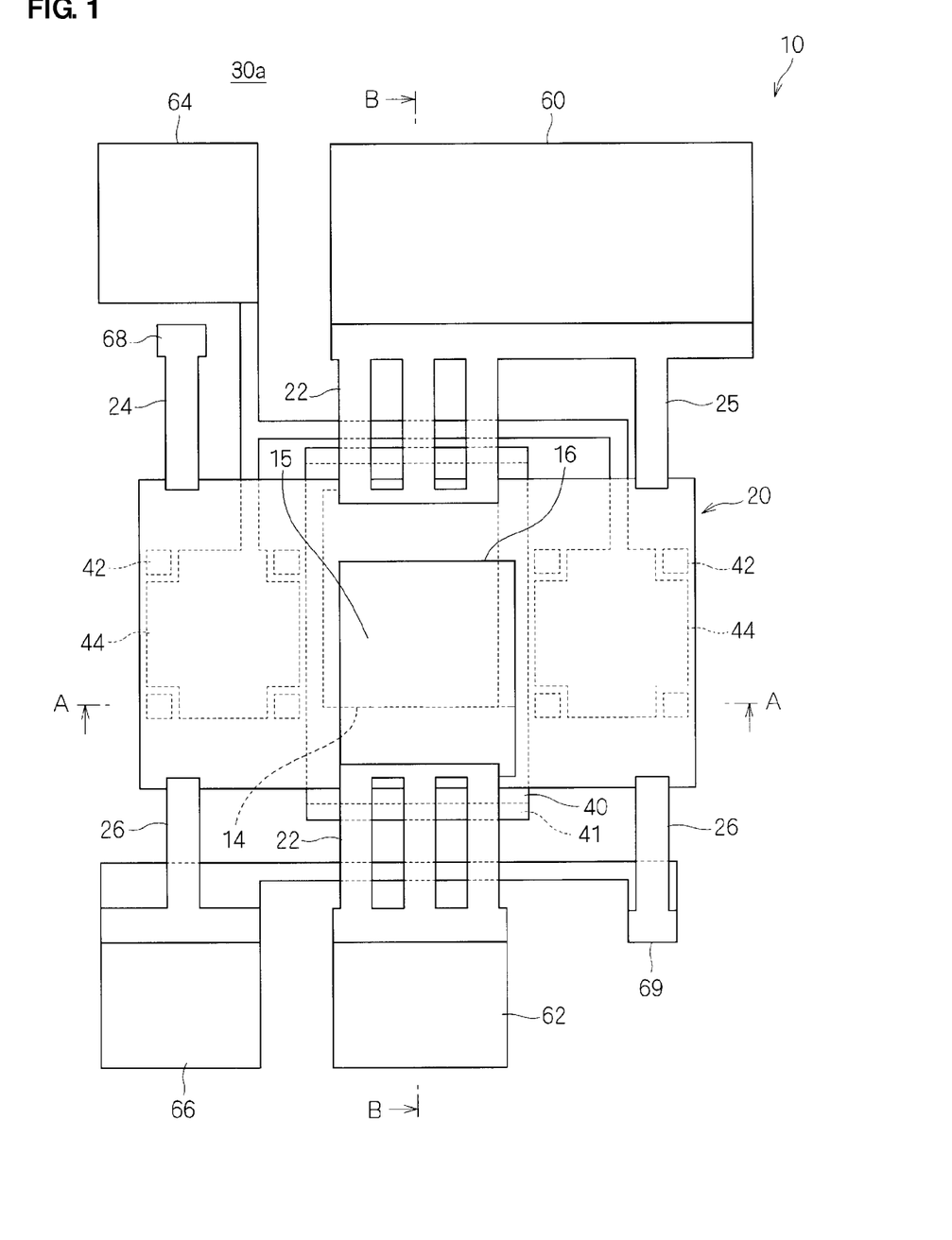
FIG. 1 is a plan view of a BAW resonator in accordance with a first preferred embodiment of the present invention.
Figure 2:
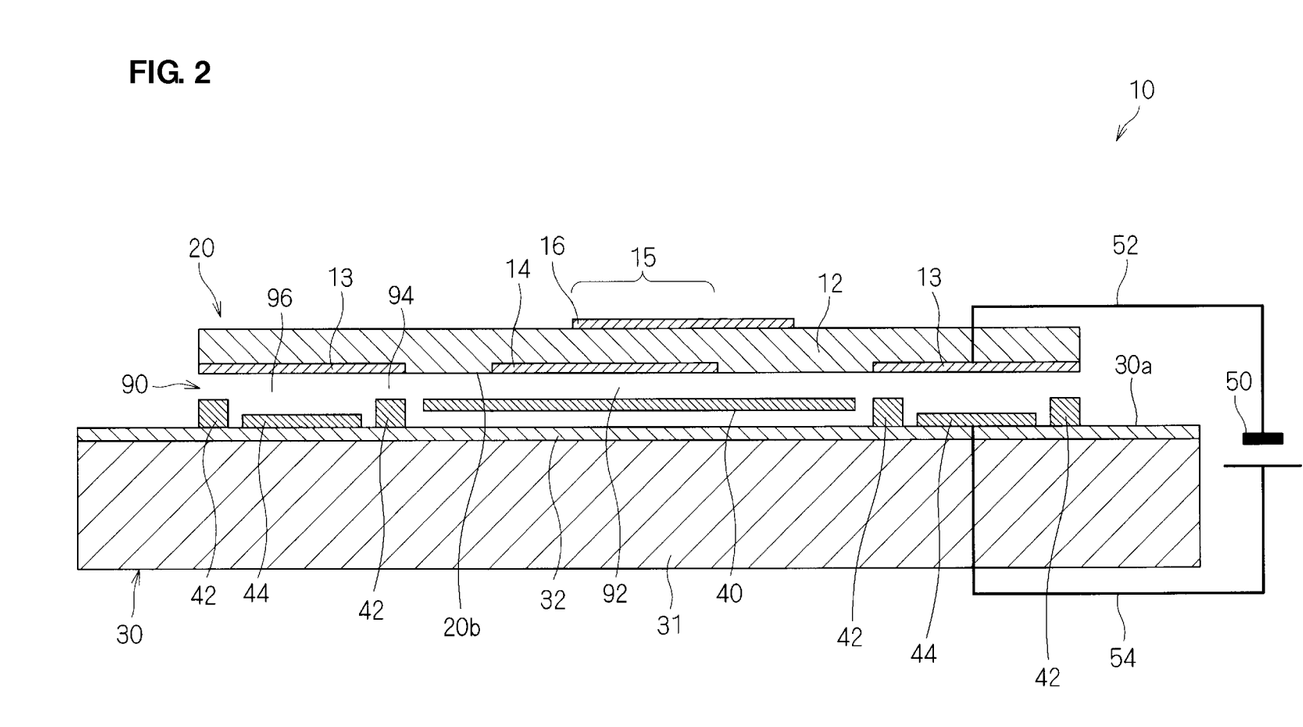
FIG. 2 is a cross sectional view cut along the A-A line of FIG. 1 of the first preferred embodiment of the present invention.
Figure 3A:
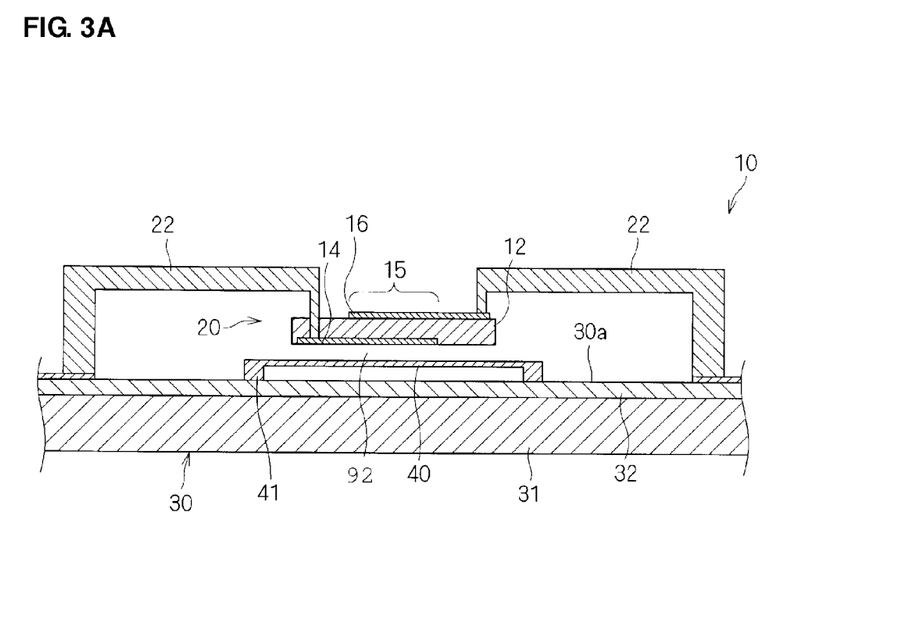
FIGS. 3A and 3B are cross sectional views illustrating a relevant portion cut along the B-B line of FIG. 1 of the first preferred embodiment of the present invention.
Figure 3B:
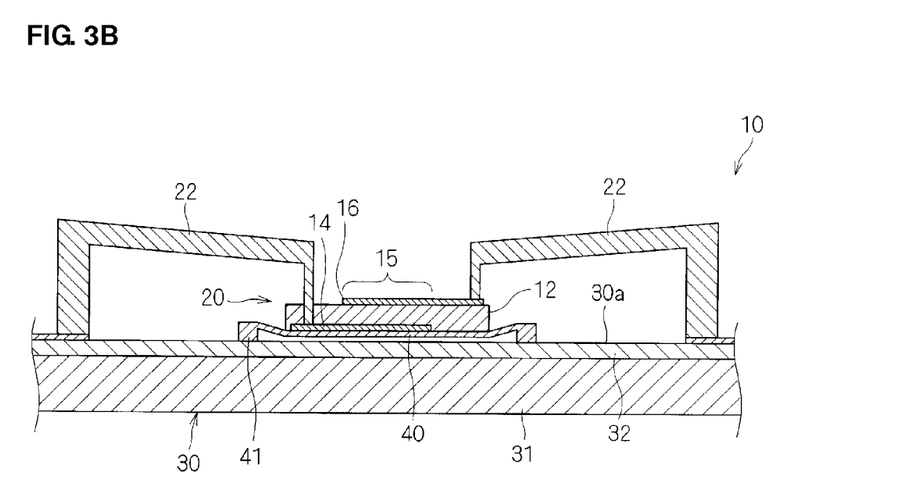

FIG. 1 is a plan view of the BAW resonator. FIG. 2 is a cross sectional view cut along the A-A line of FIG. 1. FIG. 3 is a cross sectional view of a relevant portion cut along the B-B line of FIG. 1.

As illustrated in FIG. 1 to FIG. 3, in the BAW resonator 10, a resonator section 20 is preferably supported in the air above a substrate 30 by elastically deformable support sections 22, 24, 25, and 26.

As illustrated in FIG. 2, a piezoelectric film 12 is preferably sandwiched between a pair of electrodes 14 and 16 in the resonator section 20, and a vibration region 15 is arranged therein. The vibration region 15 is an area where the electrodes 14 and 16 overlap with the piezoelectric film 12 in between when viewed from a film thickness direction. The lower electrode 14, which is one of the electrodes of the resonator section 20, faces an upper surface 30a that is a principle surface of the substrate 30. A driver electrode 13 is preferably provided on each side of the lower electrode 14 on a lower surface 20b of the resonator 20.

A membrane 40, a membrane support section 41, stoppers 42, and driver electrodes 44 are preferably arranged on the upper surface 30a of the substrate 30.

The membrane 40 is preferably a film member. The membrane 40 preferably has a rectangular shape, and a pair of its sides which face each other is fixed to the membrane support section 41 arranged on the upper surface 30a of the substrate 30. The membrane 40 is preferably fixed so as to have a distance from the upper surface 30a of the substrate 30, and faces the vibration region 15 of the resonator section 20.

The stoppers 42 and the driver electrode 44 are preferably arranged on each side of the membrane 40. The stoppers 42 are preferably protrusion portions arranged to protrude from the upper surface 30a of the substrate 30, and arranged so as to have a height somewhat lower than that of the membrane 40. The driver electrode 44 is arranged on the upper surface 30a of the substrate 30, and has a height lower than a height of the stopper 42.

The driver electrode 13 of the resonator section 20 and the driver electrode 44 of the substrate 30 face each other, and are preferably electrically connected to a drive power supply 50 via wirings 52 and 54, which are schematically illustrated in the drawing.

As illustrated in FIGS. 3A and 3B, the support section 22 is preferably an elastically deformable supporting beam that has an arched shape at a cross section, one end of which is fixed on the resonator section 20 and the other fixed on the substrate 30. The other support sections 24, 25, and 26 (see FIG. 1) also preferably have the same structure as that of the support section 22, and are each an elastically deformable supporting beam that has an arched shape at a cross section, one end of which is fixed on the resonator section 20 and the other fixed on the substrate 30.

As illustrated in FIG. 1, the support section 22 in the center is preferably defined by two sets of wiring, each of which connects one of the upper electrode 16 and the lower electrode 14 of the resonator section 20 to corresponding one of an input electrode 60 and an output electrode 62 arranged on the upper surface 30a of the substrate 30. The support sections 26 on the lower right and lower left sides of FIG. 1 are each preferably defined by a portion of a grounding wiring that connects the driver electrode 13 of the resonator section 20 and a ground electrode 66 arranged on the upper surface 30a of the substrate 30. The support section 24 on the upper left side of FIG. 1 is preferably defined by a dummy wiring that is connected to a dummy electrode 68 arranged on the upper surface 30a of the substrate 30. The support section 25 on the upper right side of FIG. 1 is defined by a dummy wiring that is connected to the input electrode 60 arranged on the upper surface 30a of the substrate 30.

A portion or all of the support sections that support the resonator section may alternatively be made of members other than the wiring, if so desired.

The BAW resonator 10 is preferably capable of having different frequency characteristics as follows depending on the presence or absence of a drive voltage across the driver electrodes 13 and 44.

As illustrated in FIG. 3A, the resonator section 20 is supported in the air above the substrate 30 when no drive voltage is applied across the driver electrodes 13 and 44. Here, the frequency characteristic similar to that of a typical BAW resonator may be obtained with bulk acoustic waves propagating through the vibration region 15 of the resonator section 20.

An electrostatic force is generated between the driver electrodes 13 and 44 when the drive voltage is applied across the driver electrodes 13 and 44. The resonator section 20 is supported by the elastically deformable support sections 22, 24, 25, and 26. Thus, the electrostatic force generated between the driver electrodes 13 and 44 causes elastic deformations in the support sections 22, 24, 25, and 26. The resonator section 20 is drawn to the substrate 30 and moves up to a predetermined position where the resonator section 20 contacts the stoppers 42. The height of the stopper 42 is somewhat lower than that of the membrane 40. Thus, the lower electrode 14 of the resonator section 20 presses the membrane 40 downward, and the lower electrode 14 of the resonator section 20 comes in close contact with the membrane 40. Here, bulk acoustic waves that propagate through the vibration region 15 of the resonator section 20 also propagate the membrane 40. Thus, a resonant frequency and an antiresonant frequency become lower compared to the case where no drive voltage is applied across the driver electrodes 13 and 44.

Both a metal and an insulator may be used as a material of the membrane 40 so as to shift the resonant and antiresonant frequencies. In order to maintain good resonant characteristics even at the time of shifting the resonant and antiresonant frequencies, the membrane 40 may preferably be made of a hard material so as to reduce a resonator's elastic loss. In general, the harder the material is, the higher the acoustic impedance becomes. Thus, the membrane may be made of a material, a primary component of which has an acoustic impedance of about $30 \times 10^5$ g/(cm$^2$·s) or higher, for example. The primary component may be, but not limited to, Mo (molybdenum), Ru (ruthenium), Rh (rhodium), Ta (tantalum), W (tungsten), Re (rhenium), Ir (iridium), or Pt (platinum).

When the application of the drive voltage across the driver electrodes 13 and 44 is stopped, there will be no electrostatic force that draws the resonator section 20 to the substrate 30. Thus, the elastically deformed support sections 22, 24, 25, and 26 return to their original shapes, and the resonator section 20 returns to the original position, which is in the air above the substrate 30.

Next, a non-limiting example of manufacturing a BAW resonator in accordance with a preferred embodiment of the present invention is described with reference to cross sectional views of FIG. 4A to FIG. 6K.

Figures 4A, 4B, 4C:
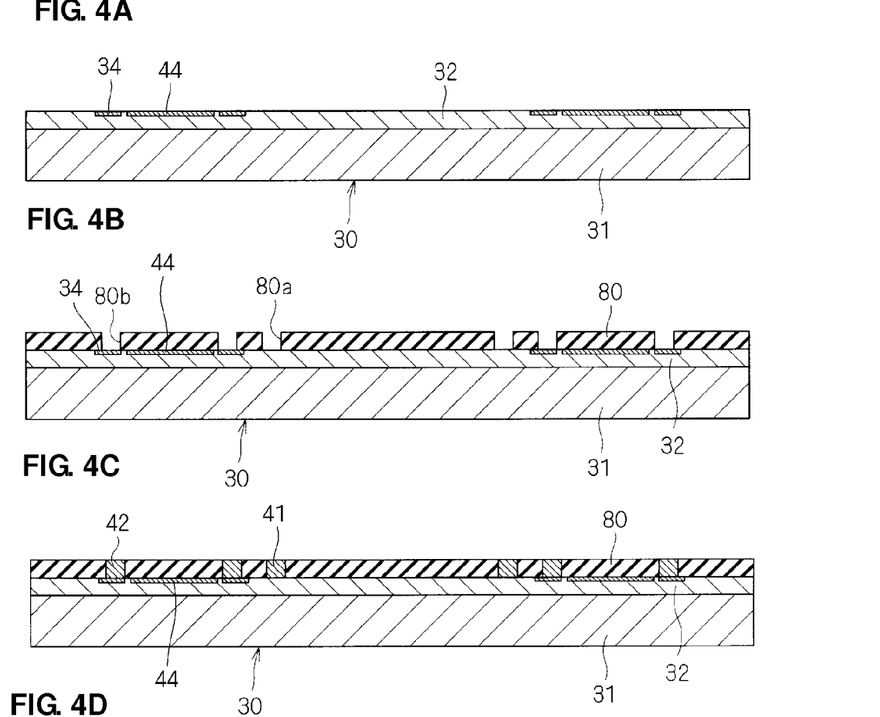
FIGS. 4A-4E are cross sectional views illustrating fabrication steps of the BAW resonator in accordance with the first preferred embodiment of the present invention.

First, as illustrated in FIG. 4A, the substrate 30 is prepared by forming a 1 μm thick SiN film 32 on a GaAs substrate 31, and then on this SiN film 32, a 10 nm thick Ti film, a 10 nm thick Pt film, and a 300 nm thick Au film are sequentially formed to form the driver electrodes 44 and underlayer electrode layers 34 for the stoppers. The underlayer electrode layer 34 and the driver electrode 44 may be buried in the SiN film 32 as illustrated in the drawing so as to align an upper surface of the SiN film 32 with an upper surface of the underlayer electrode layer 34 and the driver electrode 44.

Next, as illustrated in FIG. 4B, a 0.8 μm thick ZnO film is formed and patterned to form a sacrificial layer 80 with openings 80a and 80b.

Next, as illustrated in FIG. 4C, a 10 nm thick Ti, a 10 nm thick Pt, and a 800 nm thick Au are sequentially deposited inside the openings 80a and 80b of the sacrificial layer 80 to form the stoppers 42 and the membrane support sections 41.

Figures 4D, 4E:
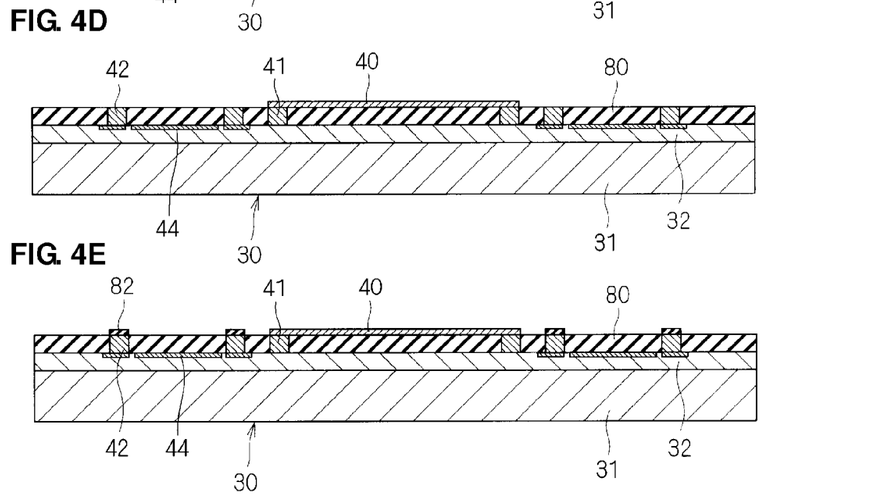

Next, as illustrated in FIG. 4D, a W film is formed by sputtering, and then patterned to form the membrane 40.

Next, as illustrated in FIG. 4E, a 0.2 μm thick ZnO is deposited only on the stoppers 42 to form sacrificial layers 82 to secure a margin that presses the membrane downward when driving.

Figure 5F:
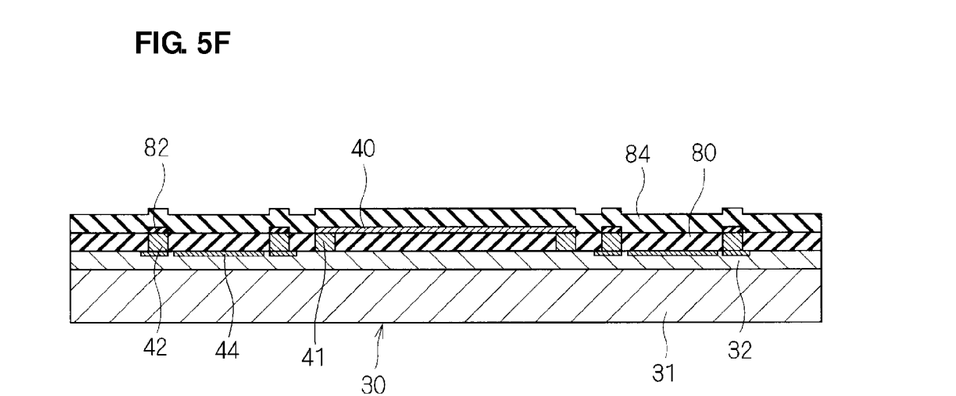
FIGS. 5F-5H are cross sectional views illustrating fabrication steps of the BAW resonator in accordance with the first preferred embodiment of the present invention.

Next, as illustrated in FIG. 5F, a 1.0 μm thick ZnO film is formed and patterned to form a sacrificial layer 84.

Figure 5G:
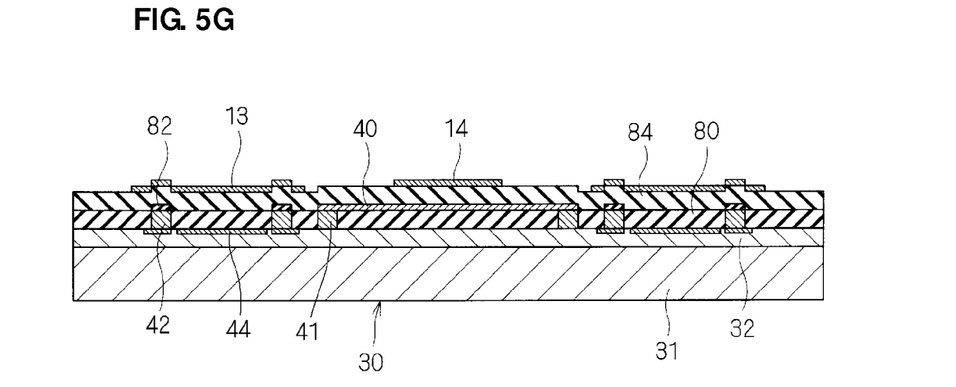

Next, as illustrated in FIG. 5G, a 0.3 μm thick Mo film is formed and patterned to form the driver electrodes 13 and the lower electrode 14 of the resonator section 20.

Figure 5H:
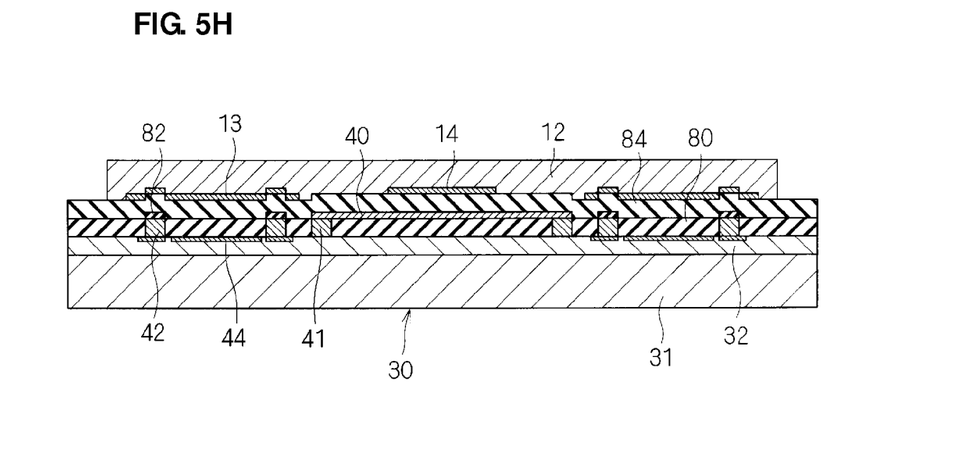

Next, as illustrated in FIG. 5H, a 1.5 μm thick AlN film is formed to be used as a piezoelectric material. The film is then patterned to form the piezoelectric film 12.

Figure 6I:
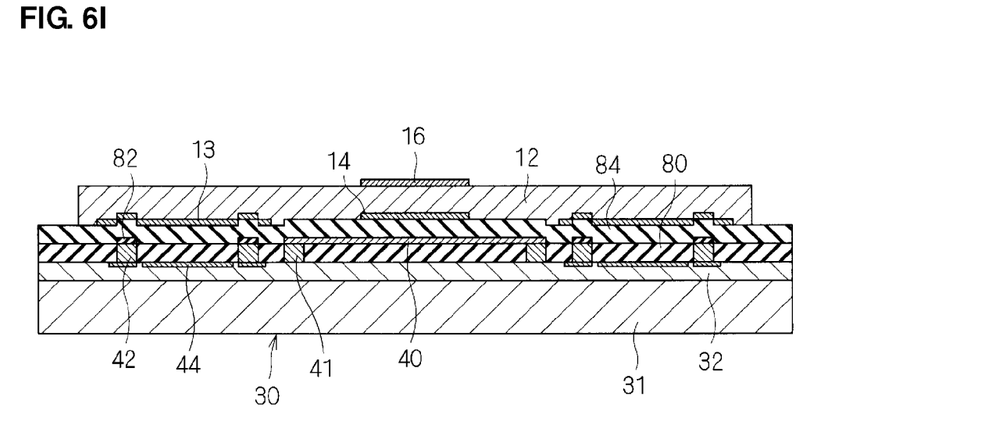
FIGS. 6I-6K are cross sectional views illustrating fabrication steps of the BAW resonator in accordance with the first preferred embodiment of the present invention.

Next, as illustrated in FIG. 6I, a 0.3 μm thick Mo film is formed and patterned to form the upper electrode 16 of the resonator section 20.

Figure 6J:
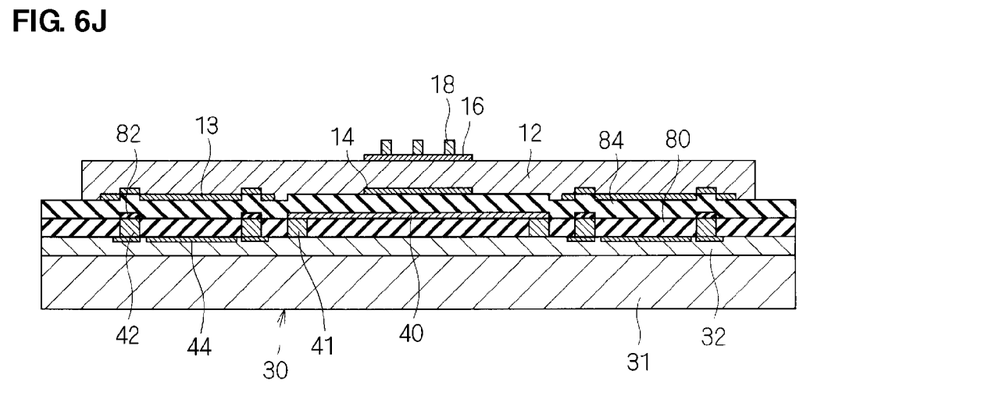

Next, as illustrated in FIG. 6J, air bridge patterns 18 are formed by Au plating as the wiring and the support section arranged to support the resonator section 20. Resist (to be removed after the formation of plating pattern), which is not illustrated in the drawing, is used between the Au plating pattern and the substrate during the formation process to form an air bridge structure that secures a space from the substrate 30.

Figure 6K:
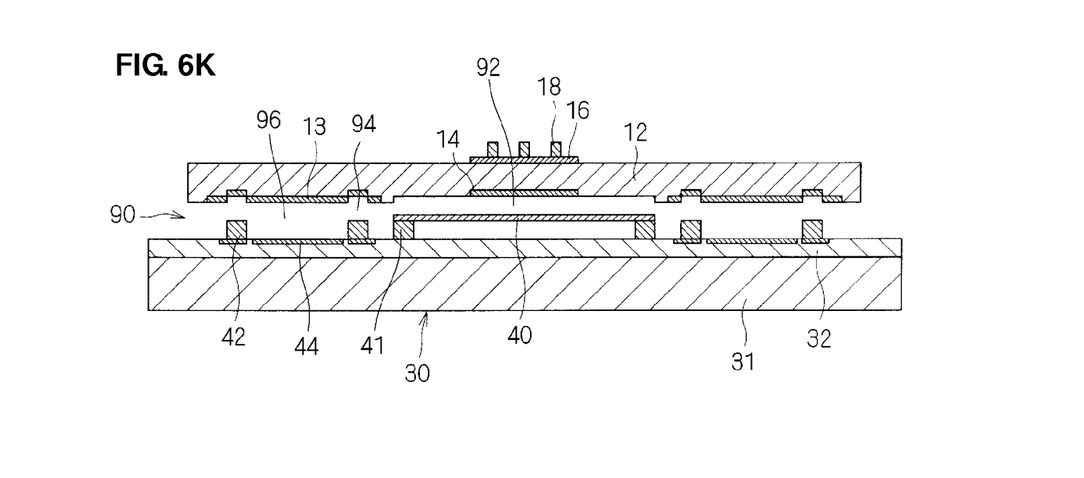

Next, as illustrated in FIG. 6K, ZnO that defines the sacrificial layers 80, 82, and 84 is removed by wet etching (preferably using, for example, a mixture of acetic acid, phosphoric acid, and water) to form an air space 90 that extends above and below the membrane 40 and below the resonator section 20.

In the BAW resonator thus fabricated, the dimension across a gap 92 between the lower electrode 14 of the resonator section 20 and the membrane 40 is 1.0 μm, the dimension across a gap 94 between the stopper 42 arranged on the substrate 30 and the resonator section 20 is 1.2 μm, and the dimension across a gap 96 between the driver electrode 44 arranged on the substrate 30 and the driver electrode 13 arranged on the resonator section 20 is 1.8 μm.

The BAW resonator thus fabricated preferably operates as a typical BAW resonator when the drive voltage applied across the driver electrodes 13 and 44 is about 0 V. When the drive voltage applied across the driver electrodes 13 and 44 is about 40 V, the whole resonator section 20 is drawn to the substrate 30 due to the electrostatic force generated between the driver electrodes 13 and 44. The lower electrode 14 of the resonator section 20 contacts the membrane 40, and the resonant frequency of the BAW resonator shifts to a lower frequency side.

Figure 7:
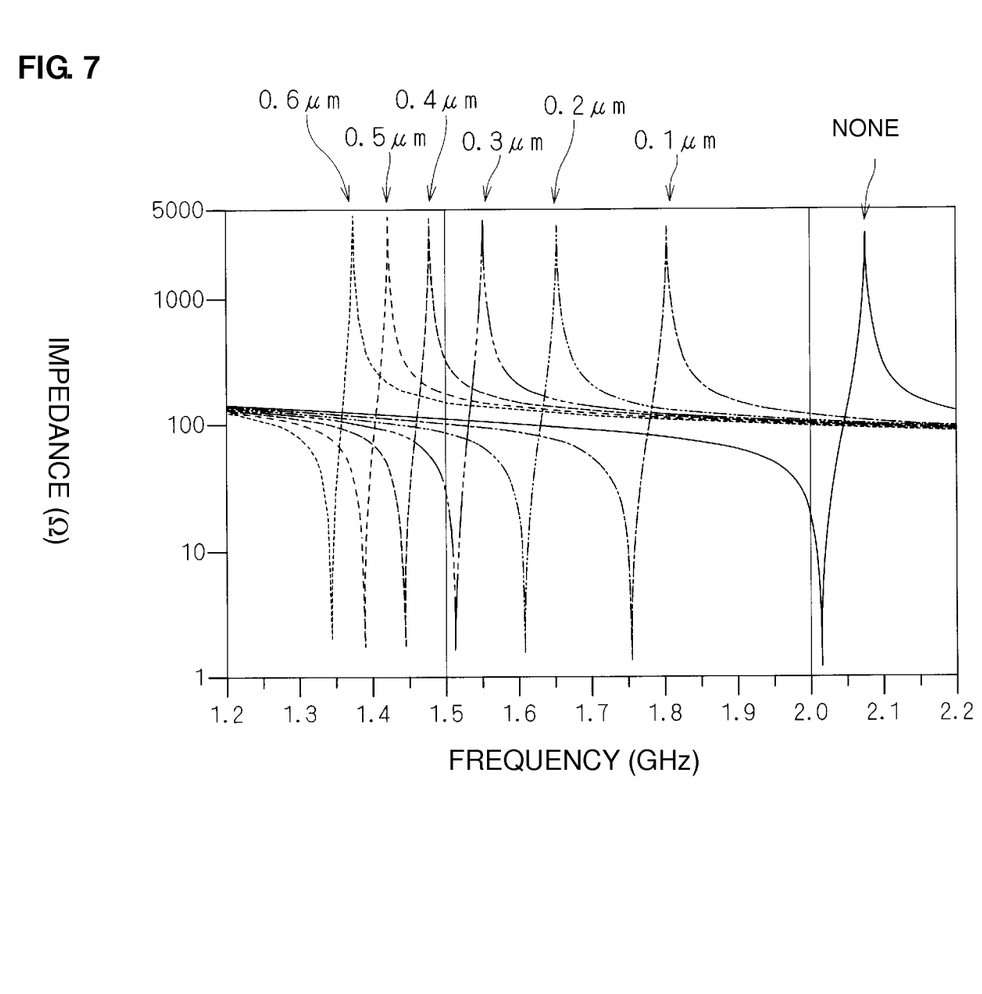
FIG. 7 is a graph illustrating a filter characteristic of the BAW resonator in accordance with the first preferred embodiment of the present invention.

FIG. 7 is a graph illustrating simulation results of impedance characteristic of non-limiting examples of manufacturing methods in which the film thickness of the membrane is set to different values. Curves with numerals represent the characteristic when the drive voltage is applied across the driver electrodes 13 and 44, and the numerals represent the film thicknesses of the membrane 40. The curve with "NONE" represents the characteristic when no drive voltage is applied across the driver electrodes 13 and 44. For example, the resonant frequency of the resonator in which the film thickness of the membrane 40 is 0.2 μm is 2.014 GHz when no drive voltage is applied, and changes to 1.608 GHz when the drive voltage is applied. The resonant frequency of the resonator in which the film thickness of the membrane 40 is 0.4 μm is 2.014 GHz when no drive voltage is applied, and changes to 1.443 GHz when the drive voltage is applied.

It is apparent from FIG. 7 that the thicker the film thickness of the membrane 40 is, the lower the resonant and antiresonant frequencies become when the drive voltage is applied.

The BAW resonator 10 is constructed such that the membrane 40 is fixed on the substrate 30 whereas the resonator section 20 that serves as the resonator is allowed to move. Thus, the movable structure may be formed near the substrate 30. In particular, by using an electrostatic drive mechanism, a driver section that moves the resonator section 20 becomes simpler in structure and lower in profile. Thus, it is possible to make the structure stable with regard to accuracy of gaps, etc. The BAW resonator 10 in accordance with a preferred embodiment of the present invention may reduce manufacturing costs since the structure and the fabrication process thereof may be simplified while reducing its footprint at the same time.

Figure 8:
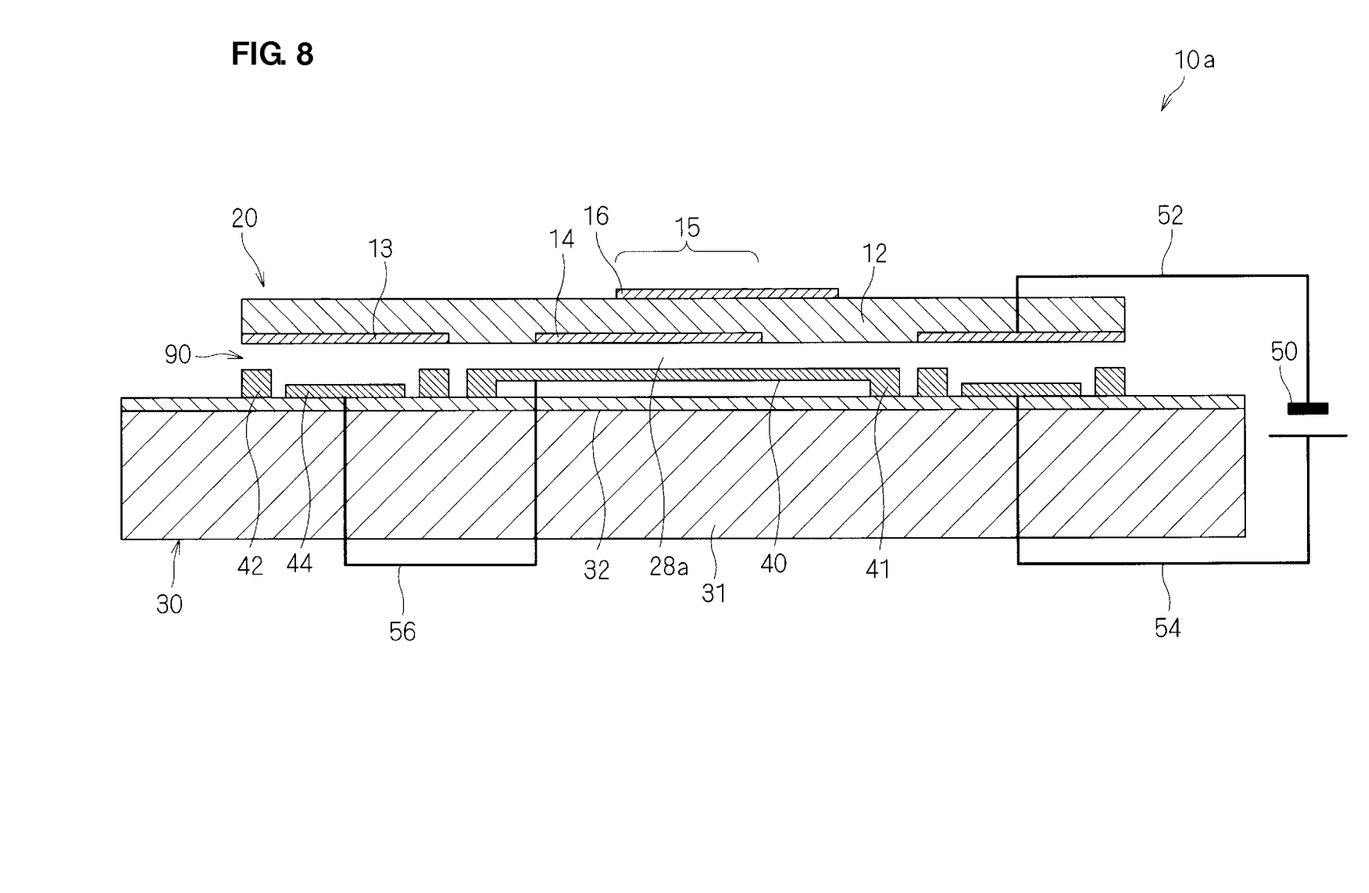
FIG. 8 is a cross sectional view of a BAW resonator in accordance with a second preferred embodiment of the present invention.

FIG. 8 is a cross sectional view illustrating a structure of a BAW resonator 10a of a second preferred embodiment of the present invention.

As illustrated schematically in FIG. 8, the BAW resonator 10a of the second preferred embodiment of the present invention preferably includes, in addition to the structure of the BAW resonator 10 of the first preferred embodiment of the present invention, a wiring 56 that connects the membrane 40 and the drive power supply 50 through the driver electrode 44 of the substrate 30 and the wiring 54. The membrane 40 is preferably made of an electrically conductive member such as, for example, a metal film.

When the drive voltage is applied across the driver electrodes 13 and 44, this drive voltage is also applied to the membrane 40 at the same time such that there is a potential difference between the membrane 40 and the lower electrode 14 of the resonator section 20. The lower electrode 14 is grounded through a high resistance resistor not shown in the drawing.

As a result, the electrostatic force is generated between the membrane 40 and the lower electrode 14 of the resonator section 20, and the membrane 40 is pressed against the lower electrode 14 of the resonator section 20. Thus, as compared to the first preferred embodiment of the present invention, the tightness of contact between the membrane 40 and the lower electrode 14 of the resonator section 20 is improved, and values of the resonant frequency and the antiresonant frequency at the time of frequency modulation become more stable. Compared to the first preferred embodiment of the present invention, it is less likely that the membrane 40 separates from the lower electrode 14 of the resonator section 20 when vibration or impact is applied, for example. Thus, the state of close contact may be securely maintained, and the frequency shift operation becomes more stable.

A filter of a third preferred embodiment of the present invention will be described with reference to FIG. 9 and FIG. 10.

Figure 9:
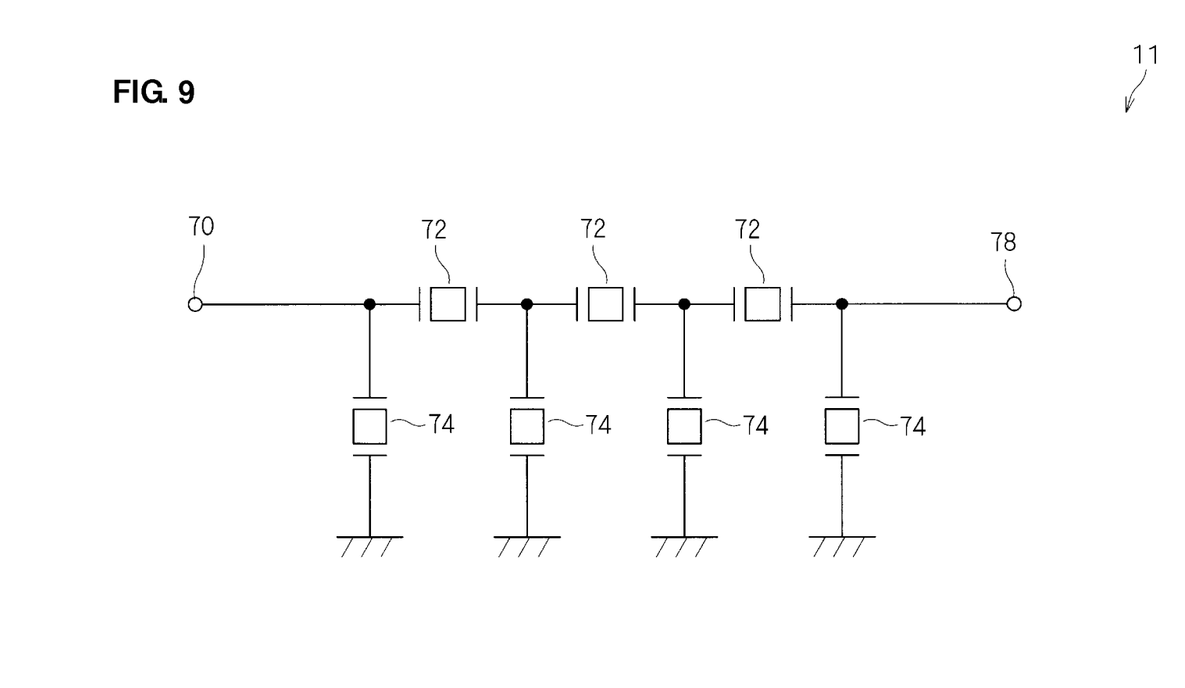
FIG. 9 is an electrical circuit diagram of a filter in accordance with a third preferred embodiment of the present invention.

FIG. 9 is a configuration diagram of a filter circuit. As illustrated in FIG. 9, in the filter 11 of Example 3, series arm resonators 72 and parallel arm resonators 74 are preferably connected in ladder shape between an input terminal 70 and an output terminal 78. The series arm resonator 72 and the parallel arm resonator 74 are BAW resonators that are identical to the fabrication example of the first preferred embodiment of the present invention except the thickness of W film of the membrane 40.

It is necessary to match the resonant frequency of the series arm resonator 72 and the antiresonant frequency of the parallel arm resonator 74 to obtain suitable filter characteristics. Thus, the suitable thickness of W film of the membrane 40 is set as in the following Table 1.

TABLE 1

|  |  | W_MEMBRANE THICKNESS [μm] | RESONANT FREQUENCY Fs [MHz] | ANTI-RESONANT FREQUENCY Fp [MHz] |
| --- | --- | --- | --- | --- |
| BEFORE APPLYING DRIVE VOLTAGE | SERIES ARM RESONATOR | None | 2014 | 2074 |
|  | PARALLEL ARM RESONATOR | None | 1956 | 2014 |
| AFTER APPLYING DRIVE VOLTAGE | SERIES ARM RESONATOR | 0.100 | 1755 | 1805 |
|  | PARALLEL ARM RESONATOR | 0.112 | 1706 | 1755 |
|  | SERIES ARM RESONATOR | 0.200 | 1608 | 1653 |
|  | PARALLEL ARM RESONATOR | 0.225 | 1566 | 1608 |
|  | SERIES ARM RESONATOR | 0.400 | 1443 | 1480 |
|  | PARALLEL ARM RESONATOR | 0.447 | 1409 | 1443 |
|  | SERIES ARM RESONATOR | 0.600 | 1345 | 1376 |
|  | PARALLEL ARM RESONATOR | 0.660 | 1315 | 1345 |

In the above Table 1, "BEFORE APPLYING DRIVE VOLTAGE" corresponds to a state where no drive voltage is applied across the driver electrodes of each BAW resonator and "AFTER APPLYING DRIVE VOLTAGE" corresponds to a state where the drive voltage is applied across the driver electrodes of each BAW resonator.

For example, when the membrane thickness of the series arm resonator is 0.2 μm, the membrane thickness of the parallel arm resonator may be set to 0.225 μm. In this way, both the resonant frequency of the series arm resonator and the antiresonant frequency of the parallel arm resonator may preferably be set to about 1608 MHz.

A difference in resonant frequency between the series arm resonator and the parallel arm resonator before driving is achieved by adjusting the film thickness of the upper electrode of the resonator section.

Figure 10:
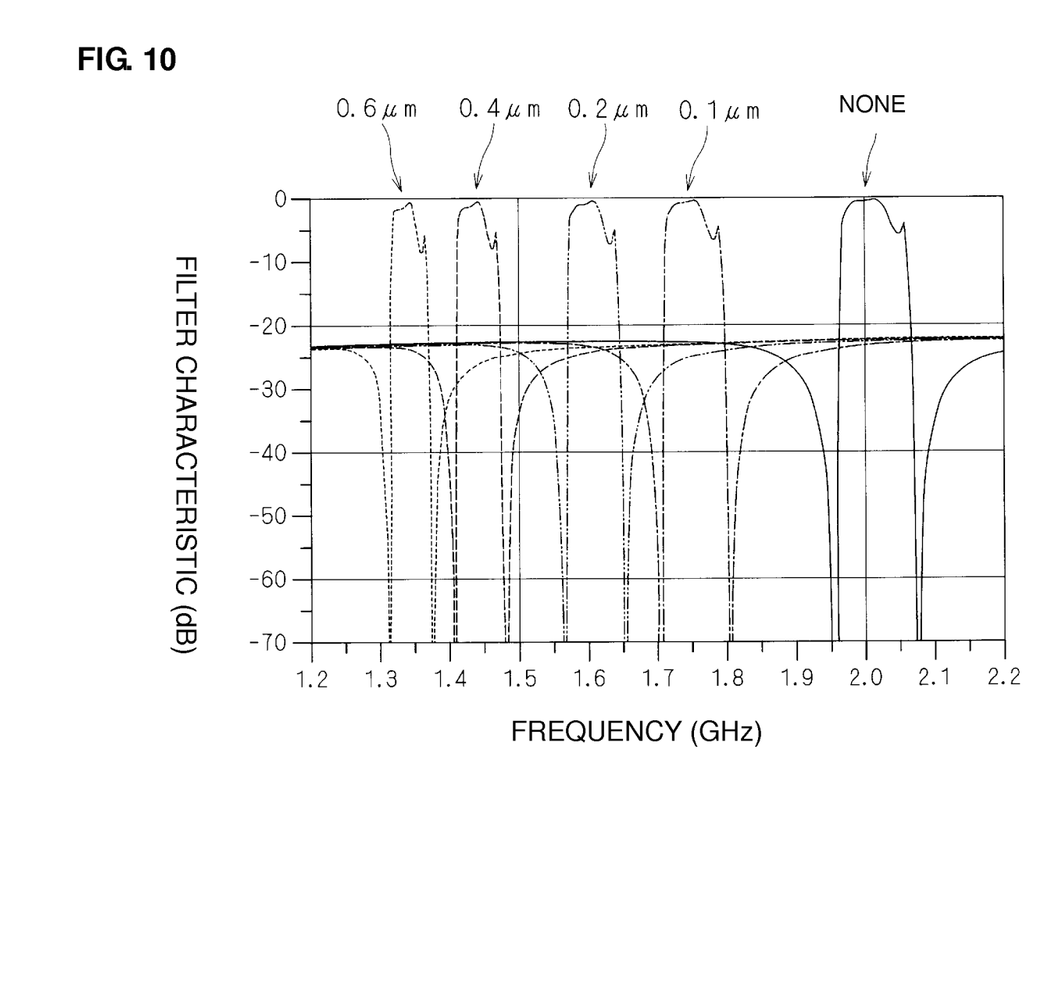
FIG. 10 is a graph illustrating a filter characteristic in accordance with the third preferred embodiment of the present invention.

FIG. 10 is a graph illustrating simulation results of filter characteristic for cases where the thickness of W film of the membrane is set to values indicated in Table 1. Curves with numerals are the characteristic when the drive voltage is applied across the driver electrodes of the respective BAW resonators 72 and 74 in the filter 11, and the numerals are the W film thicknesses of the membrane of the series arm resonator 72. The curve with "NONE" represents the characteristic when no drive voltage is applied across the driver electrodes of the respective BAW resonators. For example, in the filter 11 in which the membrane's W film thickness is 0.2 μm in the series arm resonator 72 and 0.225 μm in the parallel arm resonator 74, a passband of signal shifts from a 2 GHz band when no drive voltage being applied to a 1.6 GHz band when the drive voltage is applied. Furthermore, in the filter 11 where the membrane's W film thickness is 0.4 μm in the series arm resonator 72 and 0.447 μm in the parallel arm resonator 74, the passband of signal shifts from a 2 GHz band when no drive voltage being applied to a 1.45 GHz band when the drive voltage is applied.

It is apparent from FIG. 10 that the shift amount of passband is adjustable by varying the membrane's W film thickness.

Accordingly, the BAW resonators in accordance with the preferred embodiments of the present invention described above may be easily fabricated and capable of switching frequencies.

It is to be understood that the present invention is not limited to the foregoing preferred embodiments and may be implemented with various modifications.

For example, alternatively, a cover layer covering the lower electrode may be provided on the resonator section, and this cover layer may be configured so as to come in contact with the membrane.

The driver section is not limited to the one that uses the electrostatic force between the driver electrodes, and other mechanisms such as, for example, one that utilizes heat deformation may alternatively be provided. Furthermore, the resonator may alternatively be configured in such a way that the vibration region of the resonator section contacts the membrane when the driver section is not in operation and the resonator section separates from the membrane when the driver section is in operation.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A bulk acoustic wave resonator comprising:
   a substrate;
   a resonator section in which a piezoelectric film is sandwiched between a pair of electrodes and a vibration region is defined, the vibration region being an area where the electrodes overlap with the piezoelectric film disposed therebetween when viewed from a film thickness direction;
   a support section that is elastically deformable, connects the substrate and the resonator section in a state in which one of the electrodes of the resonator section faces a principle surface of the substrate, and allows the one of the electrodes of the resonator section to move toward and away from the principle surface of the substrate;
   a membrane arranged between the one of the electrodes of the resonator section and the principle surface of the substrate, the membrane facing the vibration region of the resonator section and being fixed on the substrate so as to be spaced away from the principle surface of the substrate; and
   driver sections arranged on the resonator section and the substrate adjacent to the vibration region and the membrane, respectively, the driver sections allowing the resonator section to move relative to the substrate such that the one of the electrodes of the resonator section moves toward and away from the principle surface of the substrate; wherein
   the vibration region of the resonator section contacts the membrane when the driver sections move the one of the electrodes of the resonator section close to the principle surface of the substrate, and the vibration region of the resonator section separates from the membrane when the driver sections move the one of the electrodes of the resonator section away from the principle surface of the substrate.

2. The bulk acoustic wave resonator according to claim 1, wherein the driver sections are respectively arranged on the resonator section and the substrate, include driver electrodes that face each other, and move the resonator section relative to the substrate with an electrostatic force generated when a voltage is applied across the driver electrodes.

3. The bulk acoustic wave resonator according to claim 1, wherein the membrane is made of a material of which a primary component is a metal having an acoustic impedance of about $30 \times 10^5$ g/(cm$^2$·s) or higher.

4. The bulk acoustic wave resonator according to claim 1, wherein
   the membrane includes a metal film; and
   a direct current voltage is applied to the metal film of the membrane when the driver sections move the one of the electrodes of the resonator section close to the principle surface of the substrate, the direct current voltage having a potential different from that of the one of the electrodes of the resonator section.

5. A filter comprising the bulk acoustic wave resonator according to claim 1.

6. The bulk acoustic wave resonator according to claim 1, further comprising stoppers arranged adjacent to sides of the membrane.

7. The bulk acoustic wave resonator according to claim 6, wherein the stoppers are defined by protrusion portions arranged to protrude from the principle surface of the substrate and which have a height lower than a height of the membrane.

8. The bulk acoustic wave resonator according to claim 1, wherein the support section has an arched shape at a cross section, one end of which is connected to the substrate and another end of which is connected to the resonator section.

9. The bulk acoustic wave resonator according to claim 8, wherein the support section includes a wiring arranged to connect the one of the electrodes of the resonator section to an input electrode or an output electrode arranged on the principle surface of the substrate.

10. The bulk acoustic wave resonator according to claim 1, wherein the vibration region of the resonator section separates from the membrane when the driver sections move the one of the electrodes of the resonator section away from the principle surface of the substrate when no drive voltage is applied across the one of the electrodes of the resonator section.

11. The bulk acoustic wave resonator according to claim 2, further comprising stoppers arranged adjacent to sides of the membrane, the stoppers are defined by protrusion portions arranged to protrude from the principle surface of the substrate and which have a height lower than a height of the membrane; wherein the resonator section contacts the stoppers when the driver sections move the one of the electrodes of the resonator section close to the principle surface of the substrate.

12. The bulk acoustic wave resonator according to claim 3, wherein the primary component of the material used to make the membrane is at least one of molybdenum, ruthenium, rhodium, tantalum, tungsten, rhenium, iridium, or platinum.

13. The bulk acoustic wave resonator according to claim 8, wherein the support section includes a dummy wiring arranged to be connected to a dummy electrode located on the principle surface of the substrate.

14. The bulk acoustic wave resonator according to claim 1, wherein a plurality of the support sections are provided, each of the plurality of the support sections has an arched shape at a cross section, one end of which is connected to the substrate and another end of which is connected to the resonator section.

15. A bulk acoustic wave resonator comprising:
   a substrate;
   a resonator section in which a piezoelectric film is sandwiched between a pair of electrodes and a vibration region is defined, the vibration region being an area where the electrodes overlap with the piezoelectric film disposed therebetween when viewed from a film thickness direction;
   a plurality of support sections that are elastically deformable, connect the substrate and the resonator section in a state in which one of the electrodes of the resonator section faces a principle surface of the substrate, and allow the one of the electrodes of the resonator section to move toward and away from the principle surface of the substrate;
   a membrane arranged between the one of the electrodes of the resonator section and the principle surface of the substrate, the membrane facing the vibration region of the resonator section and being fixed on the substrate so as to be spaced away from the principle surface of the substrate; and
   driver sections arranged on the resonator section and the substrate adjacent to the vibration region and the membrane, respectively, the driver sections allowing the resonator section to move relative to the substrate such that the one of the electrodes of the resonator section moves toward and away from the principle surface of the substrate; wherein the vibration region of the resonator section contacts the membrane when the driver sections move the one of the electrodes of the resonator section close to the principle surface of the substrate in response to a drive voltage, and the vibration region of the resonator section separates from the membrane when the driver sections move the one of the electrodes of the resonator section away from the principle surface of the substrate when no drive voltage is provided; and each of the plurality of the support sections has an arched shape at a cross section, one end of which is connected to the substrate and another end of which is connected to the resonator section.

16. The bulk acoustic wave resonator according to claim 15, wherein the membrane is made of a material of which a primary component is a metal having an acoustic impedance of about $30 \times 10^5$ g/(cm$^2$·s) or higher.

17. The bulk acoustic wave resonator according to claim 15, wherein the primary component of the material used to make the membrane is at least one of molybdenum, ruthenium, rhodium, tantalum, tungsten, rhenium, iridium, or platinum.

18. The bulk acoustic wave resonator according to claim 15, wherein the membrane includes a metal film; and a direct current voltage is applied to the metal film of the membrane when the driver sections move the one of the electrodes of the resonator section close to the principle surface of the substrate, the direct current voltage having a potential different from that of the one of the electrodes of the resonator section.

19. A filter comprising the bulk acoustic wave resonator according to claim 15.

20. The filter of claim 19, further comprising a plurality of the bulk acoustic wave resonators arranged to define series arm resonators and parallel arm resonators.

\* \* \* \* \*